(12) United States Patent
Coene et al.

(10) Patent No.: US 7,038,600 B2
(45) Date of Patent: May 2, 2006

(54) METHOD AND DEVICE FOR ADDING OR EXTRACTING A SECONDARY INFORMATION SIGNAL TO/FROM A RLL CODE SEQUENCE

(75) Inventors: Willem Marie Julia Marcel Coene, Eindhoven (NL); Johan Cornelis Talstra, Eindhoven (NL); Antonius Adriaan Maria Staring, Eindhoven (NL); Jacobus Petrus Josephus Heemskerk, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 812 days.

(21) Appl. No.: 09/929,265

(22) Filed: Aug. 14, 2001

(65) Prior Publication Data

US 2004/0161113 A1    Aug. 19, 2004

(30) Foreign Application Priority Data

Aug. 14, 2000    (EP)    ................................... 00202846

(51) Int. Cl.
*H03M 7/00*    (2006.01)
*G06Q 99/00*    (2006.01)
*H04K 1/00*    (2006.01)
*H04L 9/00*    (2006.01)

(52) U.S. Cl. .......................................... 341/59; 705/57
(58) Field of Classification Search .................. 341/59, 341/143; 360/60; 369/59.11; 375/368; 382/100; 705/57; 713/176; 714/752
See application file for complete search history.

(56) References Cited

U.S. PATENT DOCUMENTS 5,699,434 A * 12/1997 Hogan .......................... 705/57
5,774,078 A * 6/1998 Tanaka et al. .................. 341/68
5,949,834 A * 9/1999 Laud et al. .................. 375/368
6,002,718 A * 12/1999 Roth ............................. 375/240
6,188,335 B1 * 2/2001 Roth et al. ...................... 341/59
6,219,322 B1 * 4/2001 Kobayashi ............... 369/59.11
6,285,302 B1 * 9/2001 McClellan .................... 341/59
6,362,754 B1 * 3/2002 Van Dijk et al. ............. 341/59
6,490,683 B1 * 12/2002 Yamada et al. .............. 713/176
6,507,299 B1 * 1/2003 Nuijten ........................ 341/143

(Continued)

OTHER PUBLICATIONS

Marten E. van Dijk et l., "Information Carrier, Device for Encoding, Method for encoding, Device for Decoding and Method for Decoding", filed Mar. 23, 2000, U.S. Appl. No. 09/535,904.

*Primary Examiner*—Patrick Wamsley
(74) *Attorney, Agent, or Firm*—Edward W. Goodman (57) ABSTRACT

A method and device for adding or extracting a secondary information signal to/from a runlength-limited code sequence, includes detecting a polarity of a runlength at a first predetermined position of the runlength-limited code sequence and setting a parameter reflecting the degree of freedom that is present in the runlength-limited channel code, e.g., the selection of a merging bit pattern in the CD-standard, on the basis of the detected polarity so as to obtain a predetermined polarity of a runlength at a subsequent second predetermined position of the runlength-limited code sequence. The predetermined polarity then corresponds to a binary value of the secondary information. Thus, a side-channel with a small capacity is provided, which is positioned very close to the physical channel such that the secondary information is hard to be detected from the EFM bit stream. Therefore, the side-channel can be used as a hidden channel for copy protection purposes.

10 Claims, 4 Drawing Sheets

U.S. PATENT DOCUMENTS

| | | | |
|---|---|---|---|
| 6,529,147 B1 * | 3/2003 | Van Dijk et al. | 341/59 |
| 6,639,525 B1 * | 10/2003 | Coene | 341/59 |
| 6,650,257 B1 * | 11/2003 | Van Dijk et al. | 341/59 |
| 6,718,501 B1 * | 4/2004 | Brody et al. | 714/752 |
| 6,731,711 B1 * | 5/2004 | Jun | 375/368 |
| 6,765,739 B1 * | 7/2004 | Hogan et al. | 360/60 |
| 6,785,401 B1 * | 8/2004 | Walker et al. | 382/100 |
| 6,853,320 B1 * | 2/2005 | Hayami et al. | 341/143 |

* cited by examiner

METHOD AND DEVICE FOR ADDING OR EXTRACTING A SECONDARY INFORMATION SIGNAL TO/FROM A RLL CODE SEQUENCE

BACKGROUND OF THE INVENTION

1. Field of the Invention

The invention relates to a method and device for adding or extracting a secondary information signal, such as information of a hidden channel for copy protection purposes, to/from a RLL (runlength-limited) code sequence which may be recorded on a record carrier. Furthermore, the invention relates to a record carrier for storing an RLL code sequence and to a binary signal.

2. Description of the Related Art

The invention is applicable to record carriers with general RLL codes. A RLL code is characterized by two parameters, (d+1) and (k+1), which stipulate the minimum and maximum runlength, respectively, that may occur in the coded sequences (within the channel bitstream). For example, the DVD-format uses a (d=2, k=10) RLL code, called EFMPlus.

Additionally, merging bits may be used to insert a transition in order to minimize a low frequency content of the RLL code sequence. Thereby, a DC-control function can be achieved. In CD technology, the use of the 8-to-14 modulation (EFM) code leads to runlength-limited waveforms satisfying the (2,10)-constraint. These waveforms can be parsed into phrases where each phrase corresponds to a land or a pit on the surface of the CD. Each symbol of 8 data bits is mapped onto 14 channel bits. To each block of 14 channel bits, 3 extra bits are added for merging the EFM channel words and for low frequency suppression. The information is contained in the positions of the transitions. Due to the (2, 10)-constraint, the EFM code is generated in such a way that the minimum runlength is 3 channel bits and the maximum runlength is 11 channel bits. Since the three extra merging bits do not contain any information, an extra transition may (or may not) be inserted so as to prevent any violation of the minimum or maximum runlengths.

A limited multi-level modulation (LML modulation) as described in European Patent Application No. 99200873.0, corresponding to U.S. Pat. No. 6,529,147 (PHN 017369) (entitled "Decoding a Limited Multi-Level Channel"), has been proposed to incorporate a secondary channel into the main CD channel. The general idea of the LML modulation code is to use a fine-splitting of the levels of longer runlengths of the RLL code sequence. For example, runlengths of 5 up to 11 channel bits may have a small indention in the middle of the runlength. The presence or absence of this indention corresponds to the value of an extra bit stored in these longer runlengths. The presence of this indention does not disturb the classical detection of the EFM modulation code.

A drawback for LML is that the small indentions for pits (and possibly for lands) are physically observable with appropriate analytical instrumentation that can be used for inspection of the disc (like scanning electron microscopy (SEM), atomic-force microscopy (AFM)). This implies that with appropriate inspection, the area in which the secondary information signal has been written, can directly be observed.

SUMMARY OF THE INVENTION

It is therefore an object of the present invention to provide a simple secondary channel for adding a secondary information signal to the main RLL channel in such a manner that a predetermined quantity of information is accommodated in a given physical length of the RLL channel bit stream to thereby avoid that the fact of actual addition of a secondary information signal to the RLL channel bitstream can not be observed by physical inspection, and that the information is also not detectable in the standard demodulation step of the RLL code, which is based on the channel bitstream in (dk) notation. The first aspect implies that the information is physically indiscernable or hidden, i.e., cannot be localized on the disc; the second aspect implies that the information is hidden for a standard demodulation step in a standard decoding apparatus for decoding a RLL channel bitstream.

This object is achieved in a method for adding a secondary information signal to a runlength-limited code sequence, said method comprising the steps of a) detecting a polarity of a runlength at a first predetermined position of said runlength-limited code sequence; and b) setting a parameter reflecting the degree of freedom in the runlength-limited coding (e.g. a merging bit pattern in the case of CD) based on said detected runlength polarity so as to obtain a predetermined polarity of a runlength at a second predetermined position of said runlength-limited code sequence, said parameter reflecting the degree of freedom in the runlength-limited coding, preceding said second predetermined position; c) wherein said predetermined polarity corresponds to a binary value of said secondary information signal.

This object is also achieved in a method for extracting a secondary information signal from a runlength-limited code sequence, said method comprising the steps of a) extracting a runlength at a predetermined position of said runlength-limited code sequence; and b) detecting a polarity of said extracted runlength; c) wherein said detecting polarity corresponds to a binary value of said secondary information signal.

Furthermore, the above object is achieved in a device for adding a secondary information signal to a runlength-limited code sequence, said device comprising a) detecting means (19) for detecting a polarity of a runlength at a first predetermined position of said runlength-limited code sequence; b) setting means (18) for setting a parameter reflecting the degree of freedom in the runlength-limited coding, e.g., a merging bit pattern in the case of a CD, based on said detected runlength polarity so as to obtain a predetermined polarity of a runlength at a second predetermined position of said runlength-limited code sequence, said parameter reflecting the degree of freedom in the runlength-limited coding, e.g., a merging bit pattern in the case of a CD, preceding said second predetermined position; c) wherein said predetermined polarity corresponds to a binary value of said secondary information signal. In addition, this object is achieved in a device for extracting a secondary information signal from a runlength-limited code sequence, said device comprising a) extracting means (27) for extracting a runlength at a predetermined position of said runlength limited code sequence; and b) detecting means (27) for detecting a polarity of said extracted runlength; c) wherein said detected polarity corresponds to a binary value of said secondary information signal.

Moreover, this object is achieved by a record carrier for storing a runlength-limited code sequence and a secondary information, said record carrier comprising a hidden channel for storing said secondary information as a polarity of a runlength at a predetermined position of said runlength-limited code sequence, and by a binary signal comprising a runlength-limited code sequence and a secondary information, wherein said secondary information is incorporated in said binary signal as a polarity of a runlength at a predetermined position of said runlength-limited code sequence.

Accordingly, the physical carrier for the secondary or hidden channel is the polarity of a given runlength within the RLL channel bit stream. The polarity of a runlength is a binary parameter, e.g., being "1" for a mark (or pit) and being "0" for a non-mark (or land). Thus, the polarity information is only available in the detection process up and until the stage of the sampled RLL bit stream. After this stage, an inverse 1T-precoder, used for demodulation preprocessing, annihilates the polarity information. The inverse 1T-precoder generates 1-bits at transitions from pit-to-land or vice versa, and 0-bits inbetween, so that any information about the type of a given runlength (pit or land) is removed. This implies that the secondary or hidden channel is wiped out at the stage of the so-called (dk) channel bit stream required at the input of the EFM-demodulation stage. Thus, a side-channel with little capacity is generated, which is positioned closer to the physical channel than the EFM or (dk) bit stream. If this side-channel is used as a hidden-channel for copy protection, a hacker faces more hurdles to get information from beyond the EFM bit stream. The secondary or hidden channel is, therefore, deeply hidden in non-used characteristics of the disc signals, such that a special expertise in signal processing is needed to extract the hidden information from a CD player or to insert it in an unauthorized way into a CD recorder.

Preferably, the extraction step for extracting the secondary information is performed by using a detected bit stream of said runlength-limited code sequence. In view of the fact that the detected bit stream of the runlength-limited code sequence is provided before the inverse 1T-precoder, the reading of the secondary or hidden channel is only possible if the RLL sequence is available. However, since this RLL bit stream does not appear at the output of the conventional decoding IC, a complete decoder arrangement has to be developed, which requires a high degree of expertise in the concerned field. Moreover, the tools must be available to build such a decoder.

The key finding is that one channel bit of the secondary information signal can be allocated within a certain block structure of the underlying RLL channel bitstream, with preferably all blocks having the same length in terms of RLL channel bits, via the polarity (pit or land) of a single given runlength of the RLL bitstream in each block. Such a block can, for instance, be a subcode-block as defined in the CD-standard. The "writing" operation of the bit of the secondary information signal into the polarity channel is accomplished by using a degree of freedom in the RLL encoder, e.g., via the use of merging bits or substitution tables or the like, the use of which in combination with the polarity of the preceeding RLL channel bitstream will set the polarity of the given runlength to the desired value. Note that the degree of freedom in the RLL code (like the use of merging bits) is essential for writing the required polarity bit, but that the information is carried only by the polarity of the given runlength.

According to an advantageous development, we may distinguish a first predetermined runlength which is used for determining the polarity of the RLL bitstream that precedes a second predetermined runlength, the polarity of which is set according to the information bit of the secondary information signal. The polarity of the preceding RLL bitstream is determined by the history of the RLL encoding, and depends on the actual content of the data that are RLL encoded, and on the actual use of the degree of freedom in the RLL code, that depends, among others, on the strategy for DC-control (e.g., via merging bits or substitution tables).

According to a further advantageous development, the first predetermined position may correspond to a predetermined runlength of a frame synchronization word (e.g., the EFM-SYNC word), and the second predetermined position may correspond to a predetermined runlength of the S0 Sync-Pattern that is used in the very first frame of each SubCode block of the CD standard. The (dk) pattern for S0 is given by: 0210101. The second predetermined runlength for S0 may be the 11T runlength 1010, or the subsequent runlength started by the single "1" at the end.

Thus, for the example of the application in the CD-format, the polarity of the predetermined runlength is determined by a combination of the polarity of the predetermined runlength of the frame synchronization word (the EFM-SYNC) and the merging bit pattern.

Preferably, the DC-control function of the set merging bit pattern is switched off. Thereby, an erroneous setting caused by the DC-control function can be prevented.

As another (and separate) advantageous modification, the polarity of a predetermined runlength of a frame synchronization word (e.g., the first runlength of the EFM-SYNC) may be set. Thereby, however, runlength violations cannot be prevented.

BRIEF DESCRIPTION OF THE DRAWINGS

In the following, the invention will be described in more detail with reference to the accompanying drawings, in which.

DESCRIPTION OF THE PREFERRED EMBODIMENTS

In the following, the preferred embodiment of the present invention will be described on the basis of the EFM modulation code as used in the CD standard.

Figure 1:
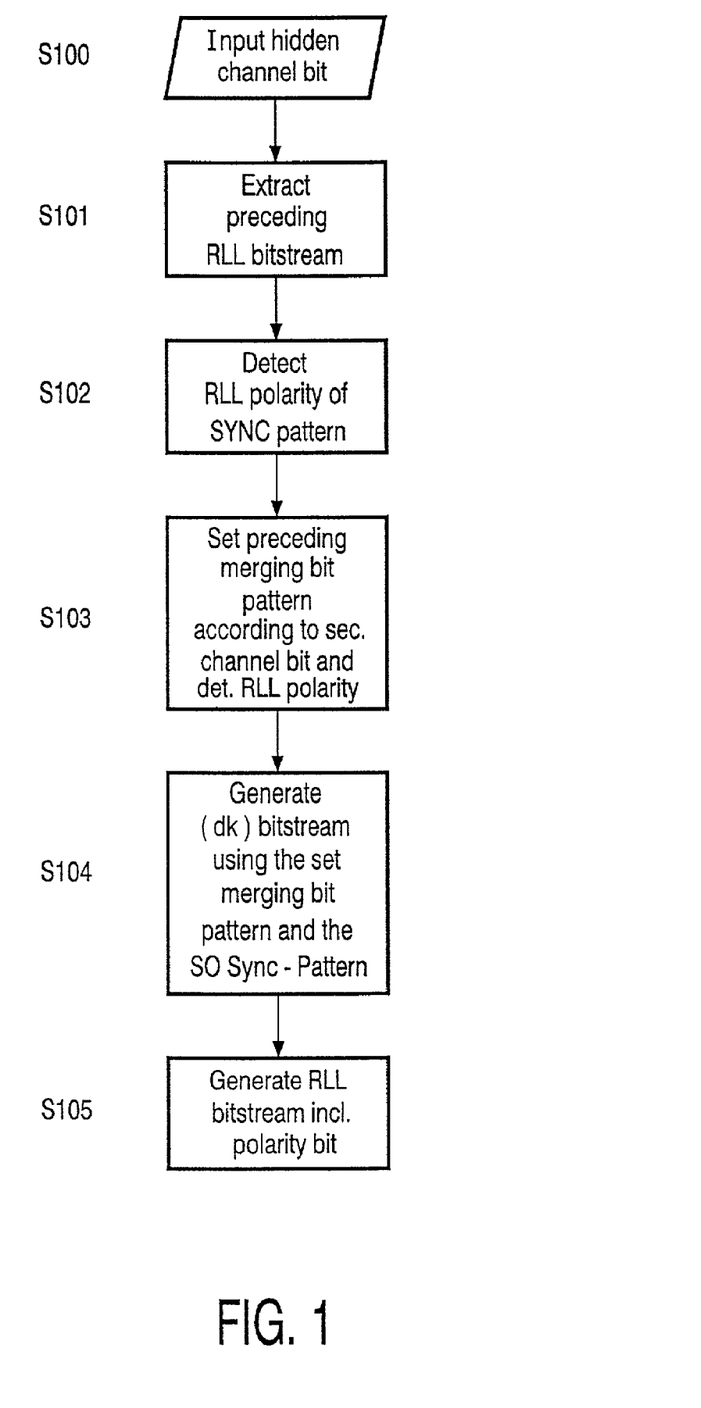
FIG. 1 shows a flow diagram of the basic steps of adding a secondary information to a runlength-limited code sequence according to the present invention.

FIG. 1 shows a flow diagram indicating basic steps of an encoding scheme for providing a hidden channel. In step S100, a hidden channel bit which is to be encoded is input or supplied to the encoding operation. Then, a preceding RLL bit stream is extracted or fed back from a code sequence which has already been encoded (step S101). The RLL polarity of a predetermined runlength of a SYNC pattern provided in the RLL bit stream is then detected in step S102. In step S103, the detected RLL polarity and the input hidden channel bit are considered in combination to set a predetermined merging bit pattern. In fact, the predetermined merging bit pattern is set on a basis of the detected RLL polarity so as to obtain a predetermined polarity at a predetermined runlength of the subsequent S0 sync pattern. Thereafter, a (dk) bit stream, in which a transition of the RLL bit stream is indicated by a bit value "1", is generated using the set merging bit pattern and the S0 sync pattern which carries the predetermined runlength (S104). Finally, the (dk)

bit stream is supplied to a 1T-precoder which generates and outputs the encoded RLL bit stream including the S0 sync pattern with a polarity according to the input hidden channel bit value (S105).

Thus, the choice of the merging bit pattern that precedes the EFM-word related to the S0 Sync pattern is dependent on two factors: (i) the value of the hidden channel bit, and (ii) the polarity of the predetermined runlength of the preceding EFM-SYNC word. It is noted that in conventional RLL encoders for CDs, the polarity information of the preceding channel bit stream (which depends on the byte-values, the merging bit strategy followed, and the preceding bits of the hidden channel) is not required.

Figure 2:
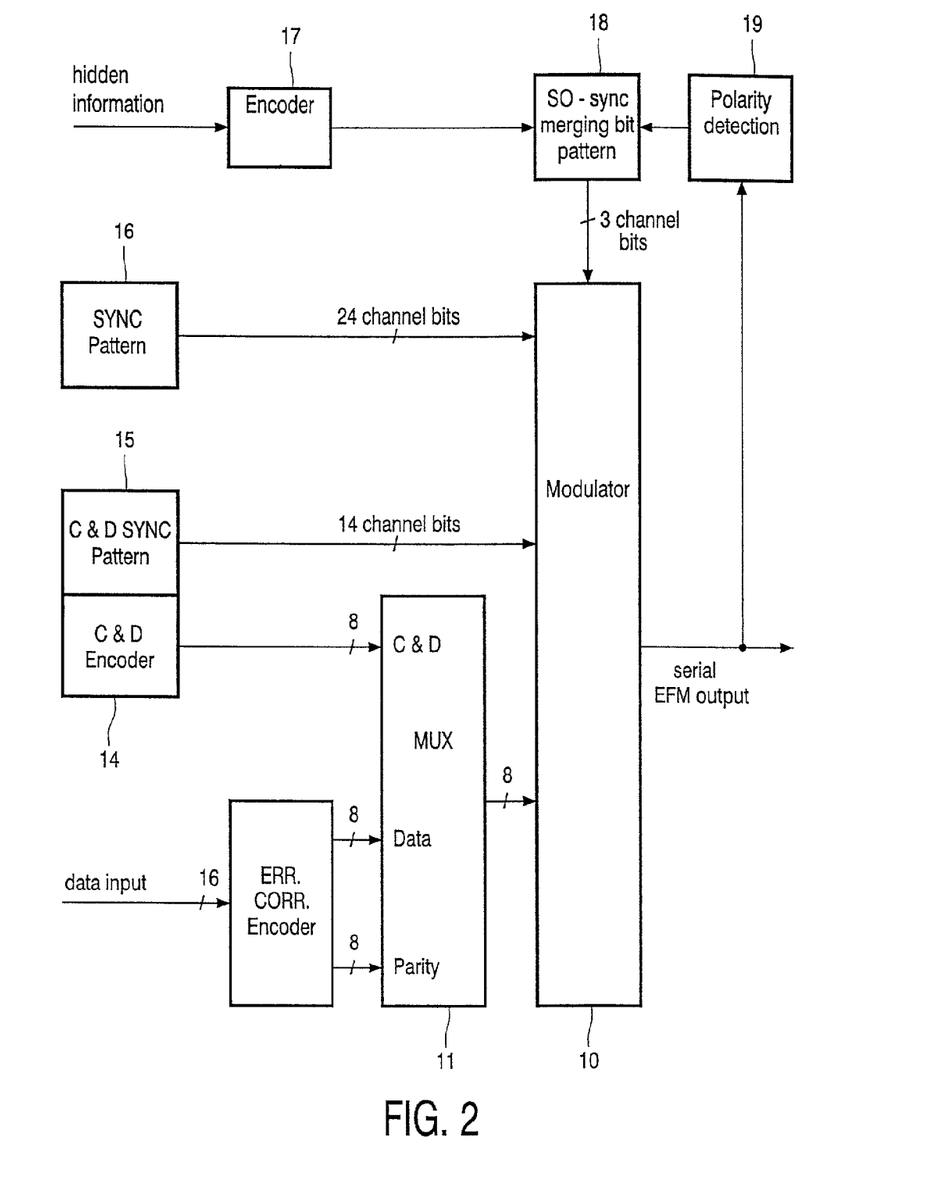
FIG. 2 shows a basic block diagram of an EFM modulator according to a preferred embodiment of the present invention.

FIG. 2 shows a basic block diagram of an EFM modulator adapted to provide the above-described hidden channel, e.g., to add a secondary or hidden information to the EFM-coded output signal. According to FIG. 2, a SYNC pattern generator 16 is provided for generating a synchronization pattern of 24 channel bits, which is added to an EFM-coded symbol sequence. In particular, the SYNC pattern or frame synchronization word consists of two runlengths of 11 channel bits and an additional runlength of 2 channel bits at the end. Thus, the synchronization pattern can be expressed in NRZ-I notation as a bit sequence 1010101010 (wherein 010 indicates a sequence of 10 bits with the logical value "0"). Furthermore, a Control-and-Display (C&D) SYNC pattern generator 15 is provided which generates 2 block synchronization patterns S0 and S1 of 14 channel bits arranged at the start of each subcode block of C&D bytes. The C&D byte is arranged behind the SYNC pattern in each frame of the EFM code sequence. Additionally, data symbols and parity symbols, each consisting of 8 data bits, are supplied from an error correction encoder 12 which is adapted to provide an error correction by introducing 8-bit parity symbols and splitting up the 16-bit input data words of the main channel into 8-bit data symbols. The time multiplexer 11 generates a proper symbol sequence from the data symbols, parity symbols and C&D symbols according to the required EFM frame structure. This symbol sequence is then supplied to an EFM modulator 10 which converts the symbol sequence into a channel bit sequence, adds the SYNC patterns and the required merging bits arranged between each of the symbols or patterns, respectively, to thereby generate a serial EFM output signal or data stream.

According to the preferred embodiment, an encoder 17 is provided to which a hidden information can be supplied so as to be added to the serial EFM output data stream by using the secondary or hidden channel. The encoder 17 is arranged to encode the input binary hidden information according to a hidden channel frame structure so as to provide a predetermined serial data stream. Each bit of the encoded data stream of the hidden information is sequentially supplied to a S0 merging-bit pattern setting unit 18 which is arranged to set the three channel bits of the merging bit pattern, provided between the SYNC pattern supplied from the SYNC pattern unit 16 and the EFM-word corresponding to the S0 Sync pattern, based on a detected polarity received from a polarity detection unit 19. The polarity detection unit 19 is arranged to extract a predetermined runlength (e.g., the first runlength) of each SYNC pattern in the serial EFM output data stream and to detect the polarity thereof. The S0 merging-bit pattern setting unit 18 is arranged to set the merging bit pattern so as to achieve a polarity of the first (or second, but always the same) internal runlength of the EFM-word corresponding to the S0 sync-pattern according to the bit value of the encoded data stream of the hidden information.

Thus, the bit value of the encoded data stream of the hidden information is stored in the polarity of the first (or second) runlength of the EFM-word corresponding to the S0 sync-pattern provided in each frame of the serial EFM output signal which may then be written on a record carrier, e.g., an optical disc. Thereby, a secondary or hidden information signal is stored on the record carrier.

The polarity detection in the polarity detection unit 19 may be based on a sampling, storing and logical bit comparing operation. The bit pattern setting in the S0 merging-bit pattern setting unit 18 may be performed by a simple logical unit determined by a corresponding truth table.

As already mentioned, the hidden channel is generated by using the S0 sync-pattern of a SubCode Block, which is the first position of the C&D channel within a SubCode block. The polarity of the first (or second) internal run of the EFM word associated with the S0 sync-pattern is controlled according to the bit value of the hidden information. The first (or second) internal run is defined as the runlength related to the first "1"-bit in the 14-bit EFM word corresponding to the S0 sync-pattern. Thus, the polarity of the first (or second) internal run of the S0 EFM word is controlled on the basis of a combination of the polarity of, e.g., the first 11T run (runlength of 11 channel bits) of the EFM SYNC pattern and the merging bit pattern. The polarity of the first 11T run of the EFM SYNC pattern is determined by the RLL encoding history of the EFM frames preceding the concerned frame, and is, therefore, also dependent on the implementation of the DC-control algorithm of a given CD drive.

Figure 3A:
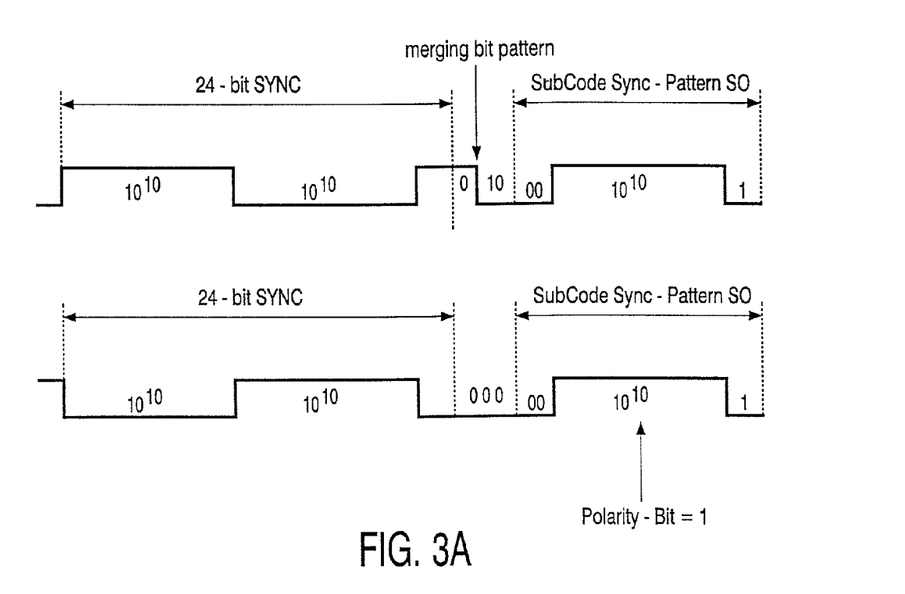
FIGS. 3A, 3B show diagrams indicating a polarity control by using preceding merging bits as performed in the preferred embodiment of the present invention.

FIG. 3A shows timing diagrams of the EFM signal at the output of the modulator 10. As can be gathered from FIG. 3A, the merging bit pattern is set according to the polarity of the first runlength (1010) of the 24-bit SYNC pattern so as to achieve a polarity-bit of the value "1" in the chosen first internal run.

Figure 3B:
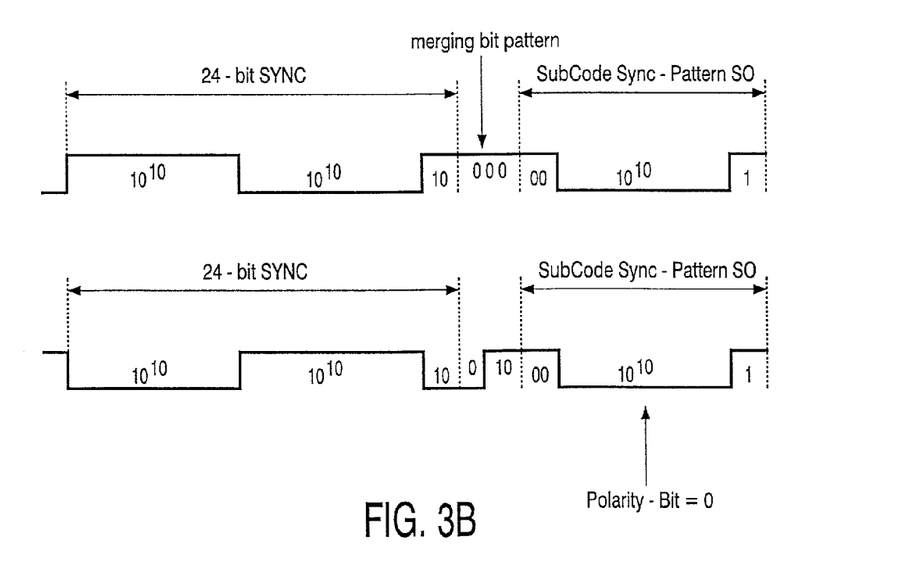

FIG. 3B shows corresponding signaling diagrams for a merging bit pattern setting required to achieve a polarity-bit of the value "0".

Thus, depending on the polarity of the first 11T-runlength of the EFM SYNC pattern, a different merging bit pattern needs to be used in order to obtain a required polarity-bit. This merging bit pattern is set by the S0 merging-bit pattern setting unit 18.

The polarity control according to the present invention provides the advantage that a predetermined quantity of secondary information can be guaranteed without introducing any runlength violations, and without any appreciable loss in the DC-control performance. As an alternative, the polarity control can be applied in the first 11T-runlength of the EFM SYNC pattern. However, this is only possible if the preceding EFM word comprises at least two trailing zeros. For the case of only one or no trailing zeros, there would be two possibilities. One is to allow runlength violations. The other is to change a merging bit pattern in the preceding channel bit stream ranging back for at maximum one EFM frame. However, the second solution also affects the DC-control performance and does not allow for a guaranteed accommodation of a bit for each EFM-frame sync in the case that no runlength violations are tolerated.

Figure 4:
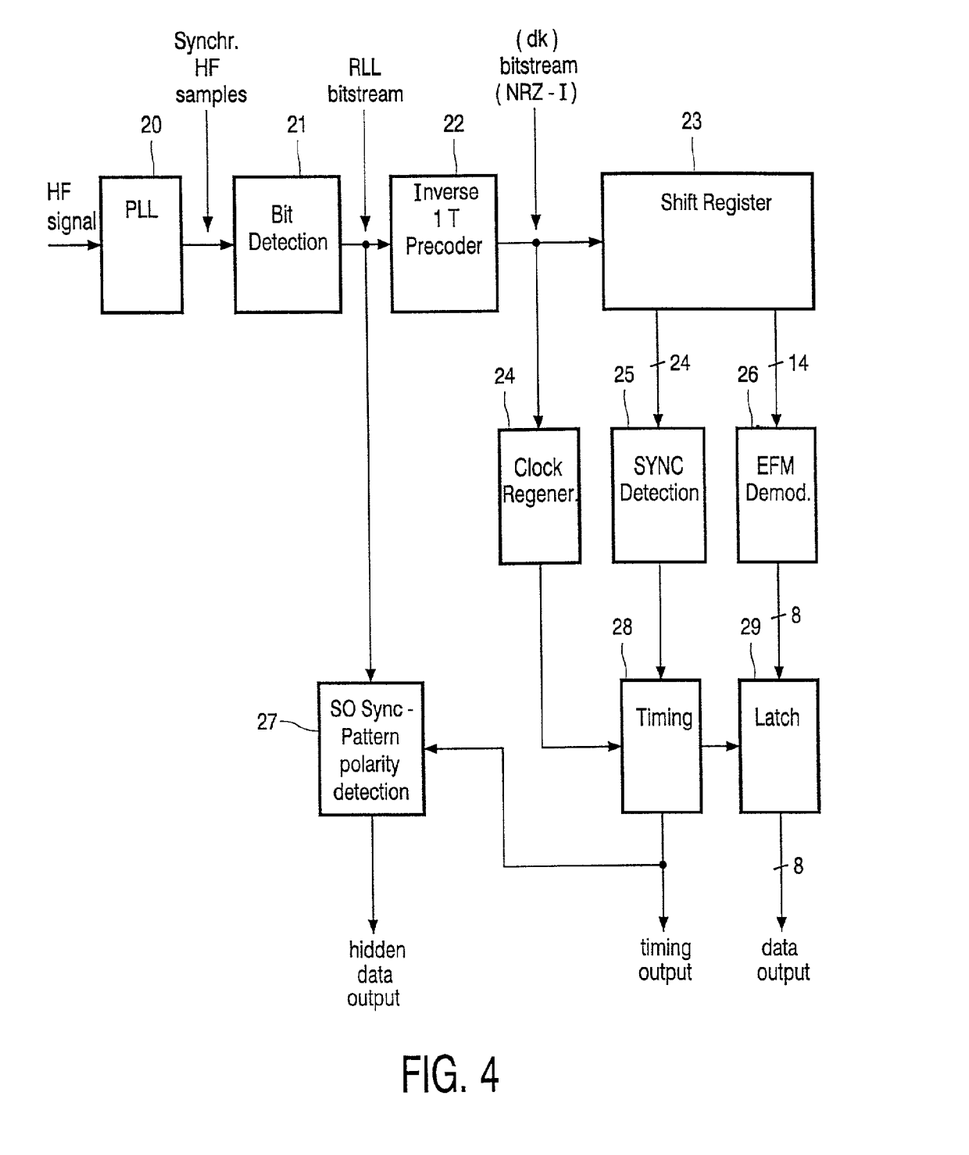
FIG. 4 shows an EFM demodulator according to the preferred embodiment of the present invention.

FIG. 4 shows a basic block diagram of an EFM demodulator according to the preferred embodiment. According to FIG. 4, the HF signal obtained, e.g., from the optical reading unit is synchronized by a phase-locked-loop (PLL) circuit 20 so as to obtain synchronized HF samples. These synchronized HF samples are supplied to a bit detection circuit 21 which generates a binary RLL bit stream comprising the polarity information of the hidden channel. Then, the RLL bit stream is supplied to an inverse 1T precoder 22 which annihilates the polarity information and generates a (dk) bit stream in which a bit of the value "1" indicates a transition of the RLL code sequence (i.e. NRZ-I notation). The (dk) bit stream is stored in a shift register 23 so as to provide parallel outputs for the channel bits of the EFM frame. The first 24 channel bits are supplied to a SYNC detection unit 25 which compares the parallel input bits with the known SYNC pattern and generates an output signal if the SYNC pattern has been detected. Additionally, the trailing 14 channel bits of the shift register are supplied to an EFM demodulation unit 26 which converts the 14 channel bits into 8 data bit symbols. This can be achieved by a ROM (read-only-memory) or a logic array circuit. The converted data bit symbols are then supplied to a latch circuit 29 where they are stored until the output thereof. Furthermore, a timing circuit 28 is provided to which a block signal obtain from a clock regeneration circuit 24 based on the (dk) bit stream is supplied. The timing unit 28 generates a timing output comprising several timing signals based on the output of the SYNC detection unit 25 and the regenerated clock signal, so as to provide a clock signal for the latch circuit 29.

The demodulation of the hidden channel information is performed by supplying the RLL bit stream at the output of the bit detection unit 21 to a polarity detection unit 27 which extracts the EFM word corresponding to the S0 sync-pattern of each SubCode block from the bit stream and detects the polarity of the first internal runlength. The detection may be performed by storing a predetermined portion of the RLL bit stream, corresponding to, e.g., one EFM frame. Then, the polarity of the first (or second) internal run of the EFM pattern related to the S0 sync-pattern may be detected by a suitable logical function. In case the first 11T-runlength of the SYNC pattern is used for the polarity control (as described for an alternative implementation), a corresponding adaptation of the polarity detection unit 27 is necessary.

Thus, the polarity detection is based on the detected RLL bit stream and not on the (dk) bit stream used for demodulating the main channel data sequence.

The present invention may also be implemented for DVD (digital video disc) applications. In this case, the 14T-runlength of the DVD SYNC pattern may be used as the special runlength for the polarity control. However, any other frame synchronization pattern provided in the DVD standard may be used.

In summary, the implementation of the present invention requires major changes in existing CD-RW drives, such as a dedicated RLL modulator or encoder, and, thus, a new integrated circuit. The reading of the hidden channel of the record carrier is only possible if the RLL sequence is available, which is not the case in usual CD players.

While the invention has been described with reference to a preferred embodiment thereto, it is to be understood that these are not limiting examples. Thus, various modifications may become apparent to those skilled in the art, without departing from the scope of the invention as defined in the claims. Particularly, the present invention is not restricted to the case of the CD-standard, and for the latter, the present invention is not restricted to the described runlengths of the frame synchronization pattern S0. Any distinguishable runlength of a data, synchronization or control word of an RLL frame can be used for the polarity detection and/or the polarity setting. Moreover, the present invention can be used in various ways to provide a side-channel for storing any kind of control information, and can be applied to any recording or encoding device and to any reproducing or decoding device for any RLL code and any recording medium or carrier.

The invention claimed is:

1. A method for adding a secondary information signal to a runlength-limited code sequence, said method comprising the steps of:
   a) detecting a polarity of a runlength at a first predetermined position of said runlength-limited code sequence; and
   b) setting a parameter reflecting the degree of freedom in the runlength-limited code sequence based on said detected runlength polarity so as to obtain a predetermined polarity of a runlength at a second predetermined position of said runlength-limited code sequence, said parameter reflecting the degree of freedom in the runlength-limited code sequence preceding said second predetermined position;
   c) wherein said predetermined polarity corresponds to a binary value of said secondary information signal.

2. The method as claimed in claim 1, wherein said first predetermined position corresponds to a predetermined runlength of a frame synchronization word, and said second predetermined position corresponds to a predetermined runlength of a S0 sync-pattern of a subcode block in CD, following said frame synchronization word in the first frame of a subcode block.

3. The method as claimed in claim 1, wherein said method further comprises the step of:
   switching off a DC-control function of said set merging bit pattern.

4. A method for extracting a secondary information signal from a runlength-limited code sequence, said secondary information being incorporated in said runlength-limited code sequence as a polarity of a runlength at a predetermined position of said runlength-limited code sequence, and said polarity being dependent on a parameter reflecting the degree of freedom in the runlength-limited code sequence based on a polarity of the runlength-limited code sequence at a further predetermined position preceding said predetermined position, said method comprising the steps of:
   a) extracting a runlength at a predetermined position of said runlength-limited code sequence; and
   b) detecting a polarity of said extracted runlength;
   c) wherein said detected polarity corresponds to a binary value of said secondary information signal.

5. The method as claimed in claim 1, wherein said secondary information signal is hidden channel information for copy protection of a record carrier.

6. The method as claimed in claim 4, wherein said extraction step is performed by using a detected bit stream of said runlength-limited code sequence.

7. A device for adding a secondary information to a runlength-limited code sequence, said device comprising:
   a) detecting means for detecting a polarity of a runlength at a first predetermined position of said runlength-limited code sequence;
   b) setting means for setting a parameter reflecting the degree of freedom in the runlength-limited code sequence based on said detected runlength polarity so as to obtain a predetermined polarity of a runlength at a second predetermined position of said runlength-limited code sequence, said parameter reflecting the degree of freedom in the runlength-limited code sequence preceding said second predetermined position;

c) wherein said predetermined polarity corresponds to a binary value of said secondary information signal.

8. A device for extracting a secondary information signal from a runlength-limited code sequence, said secondary information being incorporated in said runlength-limited code sequence as a polarity of a runlength at a predetermined position of said runlength-limited code sequence, and said polarity being dependent on a parameter reflecting the degree of freedom in the runlength-limited code sequence based on a polarity of the runlength-limited code sequence at a further predetermined position preceding said predetermined position, said device comprising:
  a) extracting means for extracting a runlength at a predetermined position of said runlength limited code sequence; and
  b) detecting means for detecting a polarity of said extracted runlength;
  c) wherein said detected polarity corresponds to a binary value of said secondary information signal.

9. A record carrier having stored therein a runlength-limited code sequence and a secondary information signal, said record carrier comprising a hidden channel for storing said secondary information signal as a polarity of a runlength at a predetermined position of said runlength-limited code sequence, said polarity being dependent on a parameter reflecting the degree of freedom in the runlength-limited code sequence based on a polarity of the runlength-limited code sequence at a further predetermined position preceding said predetermined position.

10. The record carrier as claimed in claim 9, wherein said record carrier is an optical record carrier.

* * * * *